United States Patent [19]

Metzger

[11] 4,376,900
[45] Mar. 15, 1983

[54] HIGH SPEED, NON-SATURATING, BIPOLAR TRANSISTOR LOGIC CIRCUIT

[76] Inventor: Lenard M. Metzger, 901 Elmgrove Rd., Rochester, N.Y. 14650

[21] Appl. No.: 198,580

[22] Filed: Oct. 20, 1980

[51] Int. Cl.³ .................. H03K 19/013; H03K 19/082; H03K 17/04
[52] U.S. Cl. .................................. 307/473; 307/280; 307/455; 307/549
[58] Field of Search .............................. 307/456–458, 307/473, 280, 300

[56] References Cited

U.S. PATENT DOCUMENTS

| | | | |
|---|---|---|---|
| 3,461,314 | 8/1969 | Standeven et al. | 307/456 |
| 3,473,047 | 10/1969 | Bohn et al. | 307/300 X |
| 3,614,467 | 10/1971 | Tu | 307/280 X |
| 3,676,713 | 7/1972 | Wiedman | 307/300 |
| 3,780,317 | 12/1973 | Kurata et al. | 307/280 X |
| 4,081,695 | 3/1978 | Allen et al. | 307/209 |

FOREIGN PATENT DOCUMENTS 305587 7/1971 U.S.S.R. .............................. 307/456

Primary Examiner—Larry N. Anagnos
Assistant Examiner—David R. Hudspeth
Attorney, Agent, or Firm—D. I. Hague

[57] ABSTRACT

A bipolar transistor logic circuit comprises an input terminal for receiving digital logic signals, an output terminal, an output driver including a current sink transistor and a current source transistor, and a control stage coupled between the input terminal and the output driver. When the control stage is nonconducting, the current source transistor is turned ON and the current sink transistor is turned OFF providing a first digital logic signal at the output terminal. When the control stage is conducting, the current source transistor is initially turned OFF and the current sink transistor is turned ON providing a second digital logic signal at the output terminal. If the output load does not provide the amount of current required by the current sink transistor, the current source transistor is turned ON by the control stage and provides the current sink transistor with collector current to prevent the sink transistor from saturating. In an embodiment providing a tri-state output capability, a second input terminal for receiving digital logic signals is coupled to the aforementioned control stage and to a second control stage. When both control stages are conducting, both the current source transistor and the current sink transistor are turned OFF. As a result, the output terminal is set to a high impedance state and neither provides current to nor withdraws from the output load.

1 Claim, 1 Drawing Figure

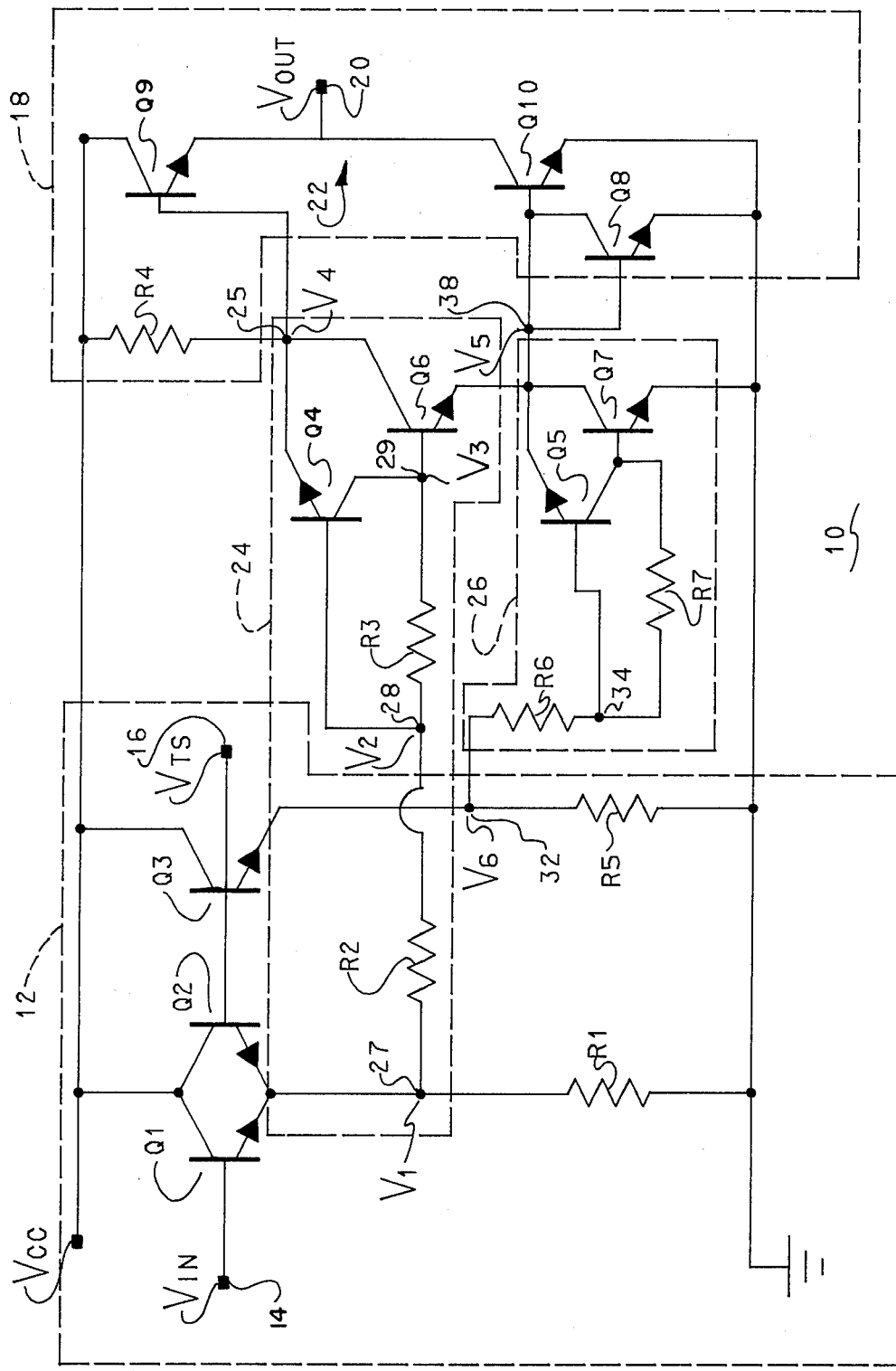

HIGH SPEED, NON-SATURATING, BIPOLAR TRANSISTOR LOGIC CIRCUIT

BACKGROUND OF THE INVENTION

1. Field of the Invention

The present invention relates to a transistor digital logic circuit and, more particularly, to the prevention of saturation in bipolar transistor digital logic circuits so as to achieve fast switching.

2. Description Relative to the Prior Art

In digital logic circuits it is highly desirable to be able to switch from one output state to the other, especially when such circuits are used in memory configurations where circuit speed is a critical factor. To obtain a fast turn-on transition, high base drive currents are used. However, a high base drive current causes the transistor to deeply saturate and store excessive base charge. This base charge has to be removed when the transistor is to be turned off and results in a long turn-off delay.

To prevent saturation, which occurs when the collector to emitter voltage of a transistor drops below about 0.1 volt, some prior art circuits have used a Schottky barrier diode in shunt with the base-collector junction of the transistor to clamp the voltage across the base-collector junction at a relatively low forward level. The disadvantage of this structure is that additional process complexity is required in making Schottky diodes.

SUMMARY OF THE INVENTION

In accordance with the present invention a logic circuit, incorporating an improved antisaturation configuration, has an input terminal for receiving digital logic signals, a first transistor connected to the input terminal and having a conductive state and a nonconductive state in response to the presence of high and low level digital logic signals, respectively, at the input terminal, an output terminal, and an output driver including a second transistor coupled between the first transistor and the output terminal and a third transistor coupled between the output terminal and ground. A control circuit coupled between the first transistor and the output driver has a first state which causes the third transistor to turn OFF and the second transistor to turn ON and produce a high level digital logic signal at the output terminal. The control circuit has a second state which initially causes the second transistor to turn OFF and causes the third transistor to turn ON and produce a low level digital logic signal at the output terminal. However, the control circuit is configured so that it turns ON the second transistor in response to a drop in the third transistor's collector voltage and provides the third transistor with collector current to maintain the collector voltage at a level which prevents the third transistor from going into saturation.

In a preferred embodiment having a tri-state output capability, a second input terminal responsive to digital logic signals is coupled to the first control circuit and to a second control circuit and provides a means for turning both of the output driver transistors OFF. The output terminal is, therefore, set to a third high impedance state and the circuit neither supplies current to nor withdraws current from the output load.

The invention and its objects and advantages will become more apparent by referring to the accompanying drawing and to the ensuing detailed description of the preferred embodiment.

BRIEF DESCRIPTION OF THE DRAWING

The drawing is a schematic diagram of a preferred embodiment of the present invention employing transistor logic with a tri-state output capability.

DETAILED DESCRIPTION OF THE PREFERRED EMBODIMENT

With reference now to the drawing, a logic circuit 10 constructed in accordance with the teachings of the present invention includes an input stage 12 having a first input terminal 14 and a second input terminal 16, an output stage 18 comprising an output terminal 20 and an output driver 22, and first and second control stages 24 and 26 coupled between the input and output stages.

The input stage 12 includes three transistors $Q_1$, $Q_2$, and $Q_3$ all arranged in an emitter-follower configuration. Transistor $Q_1$ has its base connected to the input terminal 14, its collector connected to a positive voltage source $V_{cc}$ and its emitter coupled through a resistor $R_1$ to ground. Transistor $Q_2$ has its base connected to the input terminal 16, its collector connected to $V_{cc}$ and its emitter coupled through the resistor $R_1$ to ground. Transistor $Q_3$ has its base connected to the input terminal 16, its collector connected to $V_{cc}$ and its emitter coupled through a resistor $R_5$ to ground. The input terminal 14 receives digital logic signals $V_{in}$ which cause the output driver 22 in a manner described in detail hereinbelow, to produce a high voltage (logic 1) at the output terminal 20 in response to a low input voltage (logic 0), and a low output voltage (logic 0) at the output terminal in response to a high input voltage (logic 1). The input terminal 16 receives control voltage signals $V_{ts}$ for setting the output terminal 20, in a manner described hereinbelow, in a third high impedance state.

The output driver 22 comprises a diode-connected transistor $Q_8$, transistors $Q_9$ and $Q_{10}$, and a resistor $R_4$. Transistor $Q_9$ is arranged in an emitter-follower configuration with its collector connected to $V_{cc}$ and its emitter connected to the output terminal 20. Transistor $Q_{10}$ has its collector connected to the output terminal 20 and its emitter connected to ground. The resistor $R_4$ is coupled between the base of the transistor $Q_9$ and $V_{cc}$ and the diode-connected transistor $Q_8$ is coupled between the base of the transistor $Q_{10}$ and ground. A high output voltage (logic 1) is provided at the output terminal 20 by turning transistor $Q_9$ ON and turning transistor $Q_{10}$ OFF and a low output voltage (logic 0) is provided at the output terminal 20 by turning transistor $Q_{10}$ ON and turning transistor $A_9$ OFF. Transistors $Q_9$ and $Q_{10}$ thus are driven in what is commonly called in the art a push-pull manner to in turn drive a load (not shown) at the output terminal 20.

The control stage 24 comprises (1) a transistor $Q_6$ having its collector connected to a junction 25 between the resistor $R_4$ and the base of transistor $Q_9$, and its emitter connected to the base of transistor $Q_{10}$, (2) a resistive divider comprising series resistors $R_2$ and $R_3$ coupled between the base of a transistor $Q_6$ and a junction 27 located between the emitters of the transistors $Q_1$ and $Q_2$ and the resistor $R_1$, and (3) a transistor $Q_4$ having its emitter connected to the collector of transistor $Q_6$, its collector connected to the base of $Q_6$ and its base connected to a junction 28 between the resistors $R_2$ and $R_3$.

When the circuit 10 is operating as a line driver, the control stage 24 has a nonconductive state when the voltage $V_{in}$ at the input terminal 14 is low causing the transistor $Q_{10}$ to turn OFF and the transistor $Q_9$ to turn ON. The control stage 24 has a conductive state when the voltage $V_{in}$ is high which tends to turn the transistor $Q_9$ OFF and causes the transistor $Q_{10}$ to turn ON. However, the control stage 24 is configured so that it turns ON transistors $Q_9$ in response to a drop in the collector voltage of the transistor $Q_{10}$. When turned ON, transistor $Q_9$ provides the transistor $Q_{10}$ with collector current to maintain the collector voltage of $Q_{10}$ at a level which prevents it from going into saturation.

The control stage 26 similarly comprises (1) a transistor $Q_7$ having its collector connected to the base of transistor $Q_{10}$ and its emitter connected to ground, (2) a resistive divider comprising series resistors $R_6$ and $R_7$ coupled between the base of transistor $Q_7$ and a junction 32 located between the emitter of $Q_3$ and the resistor $R_5$, and (3) a transistor $Q_5$ having its emitter connected to the base of the transistor $Q_{10}$, its collector connected to the base of transistor $Q_7$ and its base connected to a junction 34 between the resistors $R_6$ and $R_7$.

When the circuit 10 is operating in the tri-state condition, both the control stages 24 and 26 are conductive and operate to clamp the base drives to the transistors $Q_9$ and $Q_{10}$ at levels which are insufficient to turn ON either transistor. The transistors $Q_9$ and $Q_{10}$ are thus held in their nonconducting high impedance state and as a result, the output terminal neither provides current to ("sources") nor withdraws current from ("sinks") the load.

In operation with the control voltage $V_{ts}$ at input terminal 16 low, transistors $Q_2$ and $Q_3$ are turned OFF. When $Q_3$ is OFF, transistors $Q_5$ and $Q_7$ are OFF and the circuit 10 performs as a line driver in response to digital logic signals $V_{in}$ at the input terminal 14.

When $V_{in}$ is low (logic "0") transistor $Q_1$ is turned OFF. When both transistors $Q_1$ and $Q_2$ are OFF, the transistors $Q_4$ and $Q_6$ are turned OFF. Likewise with $Q_6$ OFF, transistors $Q_8$ and $Q_{10}$ are also turned OFF. Only transistor $Q_9$ is turned ON and provides a high level $V_{out}$ (logic "1") at the output terminal 20. When turned ON, transistor $Q_9$ drives the output terminal 20 with a source of current whose maximum magnitude will be dependent on the size of $Q_9$ and the size of the resistor $R_4$. Transistor $Q_9$ is arranged in an emitter-follower configuration and thus by its nature is nonsaturating.

When $V_{in}$ is high (logic "1"), transistor $Q_1$ is turned ON. When $Q_1$ is ON, current flows to the bases of transistors $Q_4$ and $Q_6$ turning them ON. When $Q_6$ is ON, it withdraws current from the base of transistor $Q_9$ tending to turn $Q_9$ OFF and provides emitter current to the bases of transistor $Q_8$ and $Q_{10}$ turning them ON. When turned ON, transistor $Q_{10}$ provides a low level $V_{out}$ (logic "0") at the output terminal 20. Transistors $Q_8$ and $Q_{10}$ form a so-called "current mirror" so that the fixed base drive and collector current supplied to $Q_8$ by transistor $Q_6$ establishes a fixed current sinking capability for transistor $Q_{10}$ which is determined by the ratio of the size of the emitter of $Q_{10}$ relative to the size of the emitter of $Q_8$. For example, if the emitter of $Q_{10}$ is four times the size of the emitter of $Q_8$, then the current at the output terminal 20 will be about four times the collector current of transistor $Q_8$.

If the output load (not shown) connected to the output terminal 20 does not provide the amount of current required by the aforementioned design of the current sink transistor $Q_{10}$, the collector voltage of $Q_{10}$ will drop below its base voltage, a condition tending to drive the transistor $Q_{10}$ toward saturation. Control stage 24 prevents the saturating of the transistor $Q_{10}$ as follows. The base current for the transistor $Q_6$ flows through resistors $R_2$ and $R_3$. The voltage $V_1$ at the junction 27 follows the input voltage $V_{in}$ (less $V_{be}$ of $Q_1$) and approaches $V_{cc} - V_{be}$ as a maximum value. The base voltage $V_3$ of transistor $Q_6$ at junction 29 is two diode drops (i.e. $V_{be}$ of $Q_6$ and $Q_8$ or 1.4 volts) above ground. The resistors $R_2$ and $R_3$ are proportioned such that the maximum voltage drop across resistor $R_3$ is approximately 0.35 volts (i.e. $\frac{1}{2} V_{be}$). Under this operating condition, the base of transistor $Q_4$ is more forwardly biased than the base of transistor $Q_6$ when transistor $Q_6$ is in the ON state. As the current through the transistor $Q_6$ increases, its collector voltage $V_4$ will drop below its base voltage $V_3$. When the difference between the base voltage $V_2$ and the emitter voltage $V_4$ of transistor $Q_4$ equals one diode drop (i.e. approximately 0.70 volts) the transistor $Q_4$ turns ON and diverts current from the base on transistor $Q_6$, thereby preventing $Q_6$ from saturating. The value of resistor $R_4$ is chosen so that both transistors $Q_4$ and $Q_6$ stabilize with collector to emitter voltages of approximately 0.3 volts. Because the base voltage $V_5$ of transistor $Q_{10}$ at junction 38 is one diode drop above ground and $V_4$ is 0.3 volts above voltage $V_5$, it follows the voltage $V_4$ is stabilized at approximately one volt above ground.

The collector current of transistor $Q_6$ flows primarily through the emitter of transistor $Q_8$. Transistor $Q_6$ also provides the base current for transistors $Q_8$ and $Q_{10}$. When the transistor $Q_{10}$ is driven toward saturation and its collector voltage $V_{out}$ drops below about 0.3 volts, the difference between the base voltage $V_4$ (approximately 1 volt) and the emitter voltage $V_{out}$ of transistor $Q_9$ (approximately 0.3 volt) is sufficient to turn the transistor $Q_9$ ON. When turned ON, transistor $Q_9$ provides transistor $Q_{10}$ with collector current and prevents the collector voltage of transistor $Q_{10}$ from going much below 0.3 volts. Transistor $Q_{10}$ is, therefore, held out of saturation by the conduction of transistor $Q_9$.

When the control voltage $V_{ts}$ is at a high level (logic "1") both transistors $Q_2$ and $Q_3$ are turned ON and the voltages at the junctions 27 and 32, i.e., $V_1$ and $V_6$, respectively, go high regardless of the level of $V_{in}$. With the voltage $V_1$ high, transistor $Q_6$ is turned ON and clamped by transistor $Q_4$ as previously described. Similarly, with voltage $V_6$ high, transistor $Q_7$ is turned ON and clamped by transistor $Q_5$ with the collector to emitter voltage of both transistors stabilizing at approximately 0.3 volts. $V_5$ is, therefore, held at approximately 0.3 volts above ground which is sufficiently low to turn OFF transistors $Q_8$ and $Q_{10}$. Voltage $V_4$ is held at 0.3 volts above voltage $V_5$ by the transistors $Q_4$ and $Q_6$. Voltage $V_4$ is, therefore, at about 0.6 volts above ground, a level which is not sufficient to turn ON transistor $Q_9$. With both transistors $Q_9$ and $Q_{10}$ disabled or nonconducting, the output terminal 20 is set to a third high impedance state and the circuit 10 neither sources nor sinks current to the output load.

The circuit 10 has been found to be extremely fast in switching, both as a line driver and into and out of the tri-state condition. Due to the nonsaturating operation provided by the control stages 24 and 26, the switching delays of the circuit 10 are almost completely determined by the value of resistor $R_4$ and the stray capacitance at the base of transistor $Q_9$.

The invention has been described in detail with particular reference to a preferred embodiment thereof, but it will be understood that variations and modifications can be effected within the spirit and scope of the invention.

I claim:

1. A tri-state digital logic circuit employing bipolar transistors operable in an unsaturated state comprising:
   (a) a first input terminal for receiving first and second digital logic signals;
   (b) voltage supply means;
   (c) a first transistor connected to the voltage supply means and to the first input terminal, said first transistor being characterized as having respective conductive and non-conductive states in response to the presence of the first and second digital logic signals at the first input terminal;
   (d) an output terminal;
   (e) an output driver stage including (1) a second transistor coupled between the voltage supply means and the output terminal, and (2) a third transistor coupled between the output terminal and ground;
   (f) a first control circuit coupled between the first transistor and the output drive stage comprising (1) a fourth transistor having a base, an emitter, and a collector, the collector being coupled to the second transistor and the emitter being coupled to the third transistor; (2) a fifth transistor having a base, an emitter, and a collector, the emitter being connected to the collector of the fourth transistor and the collector being connected to the base of the fourth transistor, and (3) a first resistive divider network coupled between the first transistor and the base of the fourth transistor and having a portion thereof coupled between the base and the collector of the fifth transistor for deriving from the voltage supply means biasing voltages that produce a greater forward bias on the fifth transistor than on the fourth transistor;
   (g) a second input terminal for receiving first and second tri-state control signals;
   (h) a sixth transistor connected to the voltage supply means and to the second input terminal, said sixth transistor being characterized as having respective conductive and non-conductive states in response to the presence of the first and second tri-state control signals at the second input terminal;
   (i) a seventh transistor connected to the voltage supply means, the second input terminal and the first control circuit, said seventh transistor being characterized as having respective conductive and non-conductive states in response to the presence of the first and second tri-state control signals at the second input terminal; and
   (j) a second control circuit coupled between the sixth transistor and the output drive stage comprising (1) an eighth transistor having a collector coupled to the third transistor and a base, (2) a ninth transistor having a base, an emitter, and a collector, the emitter being coupled to the collector of the eighth transistor and the collector being coupled to the base of the eighth transistor, and (3) a second resistive divider network coupled between the sixth transistor and the base of the eighth transistor and having a portion thereof coupled between the base and collector of the ninth transistor for deriving from the voltage supply means biasing voltages that produce a greater forward bias on the ninth transistor than on the eighth transistor, the second control circuit having a conductive state when the sixth and seventh transistors are conductive in response to the presence of the first tri-state control signal at the second input terminal for causing the fourth and eighth transistors to turn on, the fifth transistor being configured so that during the fourth transistor's conduction it turns on and (1) diverts base current from the fourth transistor and (2) clamps the collector voltage of the fourth transistor at a predetermined level, thereby preventing the fourth transistor from being driven into saturation, and the ninth transistor being configured so that during the eighth transistor's conduction it turns on and (1) diverts base current from the eighth transistor and (2) clamps the collector voltage of the eighth transistor at a predetermined level thereby preventing the eighth transistor from being driven into saturation, the collector voltages of the fourth and eighth transistors being clamped at sufficiently low levels so as to turn off the second and third transistors, whereby the output terminal is set to a high impedance output state, the second control circuit also having a non-conductive state when the sixth and seventh transistors are non-conductive in response to the presence of the second tri-state control signal at the second input terminal whereby the digital logic circuit operates as a line driver in response to the presence of the first and second digital logic signals at the first input terminal, the first control circuit having a (1) non-conductive state when the first transistor is non-conductive in response to the presence of the first digital logic signal at the first input terminal for causing the third transistor to turn off and the second transistor to turn on and produce a first digital logic signal at the output terminal and (2) a conductive state when the first transistor is conductive in response to the presence of the second digital logic signal at the first input terminal for causing the second transistor to turn off and the third transistor to turn on and produce a second digital logic signal at the output terminal, the fourth, fifth and second transistors being configured so that they turn on in response to a drop in the collector voltage of the third transistor to a predetermined level and provide the third transistor with sufficient collector current to prevent the third transistor from being driven into saturation.

* * * * *